United States Patent [19]

Otsuka et al.

[11] Patent Number: 5,802,088
[45] Date of Patent: Sep. 1, 1998

[54] STACK TYPE SEMICONDUCTOR LASER DEVICE

[75] Inventors: Yoshinori Otsuka; Kinya Atsumi, both of Okazaki; Yuji Kimura, Nagoya, all of Japan

[73] Assignee: Nippondenso Co., Ltd., Kariya, Japan

[21] Appl. No.: 719,210

[22] Filed: Sep. 25, 1996

[30] Foreign Application Priority Data

Sep. 28, 1995 [JP] Japan ................... 7-251495

[51] Int. Cl.⁶ ............... H01S 3/04; H01S 3/19; H01S 3/091; H01S 3/097
[52] U.S. Cl. ............... 372/36; 372/44; 372/75; 257/88
[58] Field of Search ............... 372/36, 43–46, 372/50, 75, 109; 257/88

[56] References Cited

U.S. PATENT DOCUMENTS

| | | | |
|---|---|---|---|
| 4,901,325 | 2/1990 | Kato et al. | 372/44 |
| 5,086,431 | 2/1992 | Hardy, Jr. et al. | 372/36 |
| 5,355,382 | 10/1994 | Kovacs et al. | 372/36 |
| 5,477,063 | 12/1995 | Shakuda | 372/45 |
| 5,488,233 | 1/1996 | Ishikawa et al. | 372/45 |
| 5,604,761 | 2/1997 | Seki et al. | 372/43 |
| 5,638,391 | 6/1997 | Shima et al. | 372/36 |
| 5,644,586 | 7/1997 | Kawano et al. | 372/44 |

FOREIGN PATENT DOCUMENTS 5-041561 2/1993 Japan.
6-283807 10/1994 Japan.

Primary Examiner—Rodney B. Bovernick
Assistant Examiner—Quyen Phan Leung
Attorney, Agent, or Firm—Cushman Darby & Cushman IP Group of Pillsbury Madison & Sutro LLP

[57] ABSTRACT

A stack type semiconductor laser device, which has a large overlapped area of beam patterns made by laser beams irradiated from a plurality of semiconductor laser elements, is disclosed. A first semiconductor laser element is formed on an N-type semiconductor substrate and is bonded to a surface of a pedestal at the side of an N-type electrode thereof through a solder layer. On the other hand, a second semiconductor laser element is differently formed on a P-type semiconductor substrate, and an N-type electrode thereof is bonded to a P-type electrode of the first semiconductor laser element through a solder layer in such a way that the laser beam irradiation planes of both semiconductor laser elements face in the same direction.

11 Claims, 4 Drawing Sheets

STACK TYPE SEMICONDUCTOR LASER DEVICE

CROSS REFERENCE TO RELATED APPLICATION

This application is based upon and claims the benefit of priority of the prior Japanese Patent Application No. 7-251495 filed on Sep. 28, 1995, the contents of which are incorporated herein by reference.

BACKGROUND OF THE INVENTION

1. Field of the Invention

The present invention generally relates to semiconductor lasers, and more particularly to a stack type semiconductor laser device suitable to obtaining large output laser beams.

2. Related Arts

A laser radar system, which can measure the distance from a vehicle equipped with the laser system to a vehicle running ahead thereof and thereby maintains the distance to the fixed value or sounds the alarm for an excessive closeness if the vehicle comes to be too close to the vehicle running ahead thereof, has been proposed.

It is required for such system to detect an object located 100 m ahead thereof. To satisfy such specifications, it is requested for the semiconductor laser device to have an optical output of 40 W to 80 W in pulse driving. As a one-chip laser element available in the market can only have as small as an optical output of 10 W to 20 W at most in practical application, several semiconductor laser elements are vertically stacked and bonded by brazing to obtain a large optical output.

FIG. 6 illustrates a prior art of such stack type semiconductor laser device (the Japanese Unexamined Patent Publication No. 5-41561). This semiconductor laser device is constructed by stacking semiconductor laser elements 3 and 4 on a P-type or N-type substrate 1 on the central part thereof through brazing metals. Here, both the semiconductor laser elements 3 and 4 are manufactured by means of epitaxial growth on individual substrates different from the substrate 1 for a semiconductor laser element 2.

When laser beams are irradiated from both the semiconductor laser elements 3 and 4 ahead of a lens 5 of an actual optical instrument as illustrated in FIG. 7, respective beam patterns 6 and 7 are obtained. These beam patterns 6 and 7 are formed by the laser beams irradiated from the respective semiconductor laser elements 3 and 4.

According to this construction, laser beams irradiated from the semiconductor laser element 3 advance in an optical path P1 and form the beam pattern 6 in a position illustrated in FIG. 7. On the other hand, laser beams irradiated from the semiconductor laser element 4 advance in an optical path P2 and form the beam pattern 7 in a position illustrated in FIG. 7.

Here, when the stack type laser device is applied to a distance measuring radar system, a distance L1 between both the semiconductor laser elements 3 and 4 and the lens 5 is much shorter than a distance L2 between the lens 5 and both the beam patterns 6 and 7. For use in a vehicle, for example, the distance L1 is approximately 20 mm and the distance L2 is up to 100 m.

As illustrated in FIG. 6, the stack type semiconductor laser device according to the prior art is constructed by simply stacking for two or more tiers of semiconductor laser elements. Here, the respective semiconductor laser elements are manufactured by means of epitaxial growth on the corresponding substrates of the same conductivity type of P-type or N-type.

Due to such construction, a gap D1 between the light emitting layer of the semiconductor laser element 3 on the first tier and the light emitting layer of the semiconductor laser element 4 on the second tier in FIG. 7 is as wide as the thickness of the substrate as illustrated in FIG. 7. Normally, such gap D1 is approximately 100 μm.

Accordingly, when the distance L1 is approximately 20 mm and the distance L2 is 100 m, for example, as described above, the gap D1 appears as the gap D2 between the centers of the respective beam patterns at 100 m ahead of the lens 5. Here, if the used optical instrument is of simple structure, the gap D2 can be expressed by the following equation (1):

$$D2 = D1 \times L2/L1 \tag{1}$$

By substituting L1=20 mm, L2=100 m and D1=100 μm for this equation (1), D2=50 cm can be obtained.

This means that the overlap of these two laser beams deviates by 50 cm, and as illustrated in FIG. 8, the area where the laser beam intensity is uneven ahead of the lens 5 greatly increases. As a result, there is a problem that the precision of distance measurement is degraded.

SUMMARY OF THE INVENTION

In view of this problem and in order to give a solution to the problem, it is an object of the present invention to provide a stack type semiconductor laser device which can maximize the overlapped area of beam patterns formed by laser beams irradiated from the respective semiconductor laser elements by contriving the stacking structure for a plurality semiconductor laser elements.

In order to achieve the object of the present invention described above, a semiconductor laser device according to the present invention is constructed by bonding a P-type electrode of a first semiconductor laser element formed on an N-type substrate and an N-type electrode of a second semiconductor laser element formed on a P-type substrate through a brazing metal.

According to such construction, both the semiconductor laser elements are bonded to each other so that the respective light emitting layers approximate to each other. For this reason, in an application to an actual optical instrument, when laser beams are irradiated forward from both the semiconductor laser elements, the overlapped area of both the beam patterns of the respective laser beams increases, and thereby the area where the laser beam intensity of the respective beam patterns is uneven can be decreased. As a result, when such stack type semiconductor laser device is applied to a distance measuring laser radar system, the precision of distance measurement can substantially be improved.

BRIEF DESCRIPTION OF THE DRAWINGS

These and other objects, features and characteristics of the present invention will be appreciated from a study of the following detailed description, the appended claims, and drawings, all of which form a part of this application. In the drawings:

DETAILED DESCRIPTION OF THE PRESENTLY PREFERRED EXEMPLARY EMBODIMENTS

An embodiment according to the present invention will now be described referring to FIGS. 1 through 4.

Figure 1:
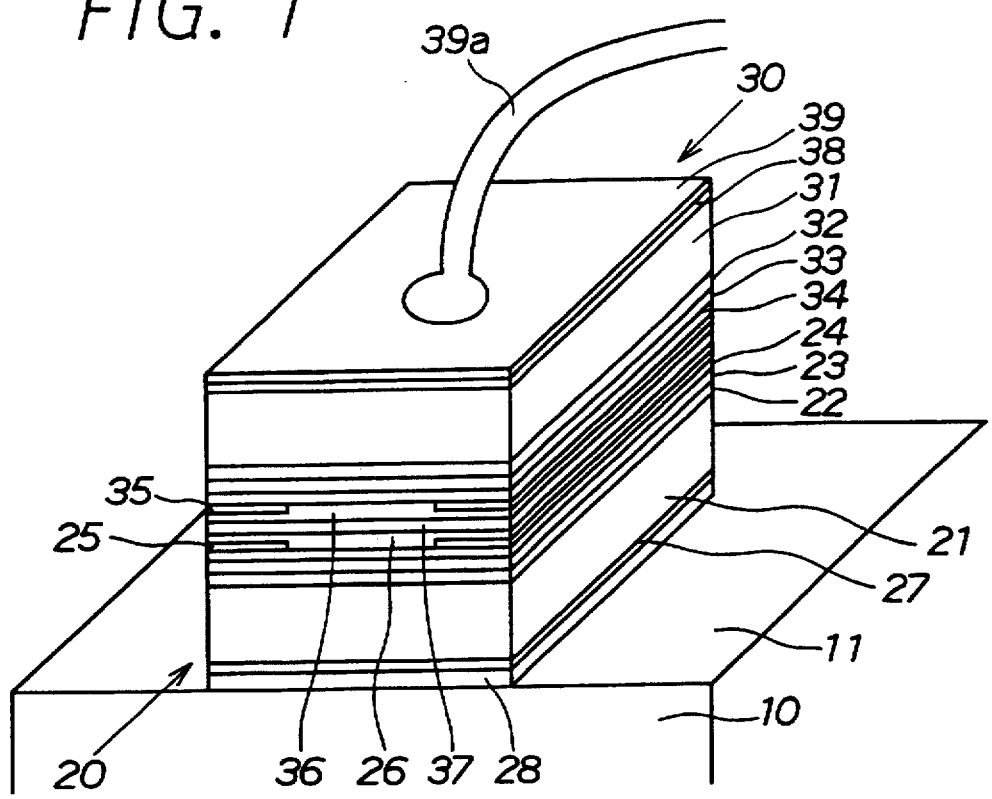
FIG. 1 is a perspective view illustrating an embodiment of a stack type semiconductor laser device according to the present invention.

FIG. 1 illustrates a stack type semiconductor laser device with large optical output according to the present invention, which is suitable to laser radar systems for measuring the distance from the vehicle ahead.

This semiconductor laser device is equipped with a pedestal 10, a surface 11 of which being gilded.

The semiconductor laser device is structured by semiconductor laser elements 20 and 30 of quantum well structure stacked and bonded on top of another.

Figure 2:
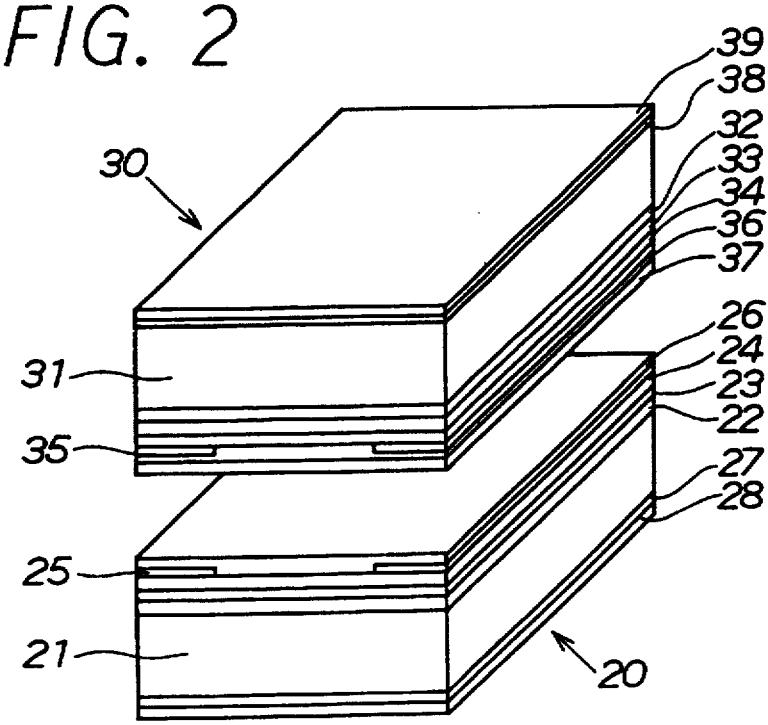
FIG. 2 is a perspective view of both semiconductor laser elements constructing the semiconductor laser device of FIG. 1.

The semiconductor laser element 20, as shown in FIG. 2, is formed on an N-type GaAs substrate 21. That is to say, on the N-type GaAs substrate 21 are grown on top of another an N-type cladding layer 22 of AlGaAs, a light emitting layer 23 constructed of superlattices of GaAs and AlGaAs, and a P-type cladding layer 24 of AlGaAs by an epitaxy, such as molecular beam epitaxy (MBE), metalorganic chemical vapor deposition (MOCVD) and liquid phase epitaxy (LPE).

According to circumstances, an N-type GaAs buffer layer (not illustrated) may be disposed between the N-type GaAs substrate 21 and the N-type cladding layer 22, and furthermore, a P-type GaAs contact layer (not illustrated) may be disposed on the top surface of the P-type cladding layer 24.

On the top surface of the P-type cladding layer 24, an insulating layer 25 of SiO$_2$ is disposed and patterned to the prescribed shape as shown in FIG. 2. A P-type electrode 26, which serves as an upper electrode of the semiconductor laser element 20, is formed by depositing a thin film of Cr/Au by vacuum evaporation method on the top surface of the P-type cladding layer 24 through the insulating layer 25 and then heat-treating this deposited thin film at approximately 360° C. to achieve an ohmic contact.

On the other hand, an N-type electrode 27, which serves as a lower electrode of the semiconductor laser element 20, is formed by depositing a thin film of AuGe/Ni/Au by vacuum evaporation method on the back surface of the N-type substrate 21 and then heat-treating this deposited thin film to achieve an ohmic contact. on the bottom surface of the N-type electrode 27 is further formed by vacuum evaporation method a solder layer 28 to be bonded to the surface 11 of the pedestal 10. The solder layer 28 is constructed of each thin films of Sn and Au, the thickness of the Sn thin film being 800 nm and the thickness of the Au thin film being 200 nm.

On the other hand, the semiconductor laser element 30 is formed on a P-type GaAs substrate 31 as shown in FIG. 2. Like the semiconductor laser element 20, layers making up the semiconductor laser element 30 are grown on the P-type substrate 31. That is to say, on the P-type GaAs substrate 31 (a side lower than the substrate 31 in FIG. 2) are grown on top of another a P-type cladding layer 32 of AlGaAs, a light emitting layer 33 constructed of superlattices of GaAs and AlGaAs, and an N-type cladding layer 34 of AlGaAs in the same way as the formation of the N-type cladding layer 22, light emitting layer 23 and P-type cladding layer 24 of the semiconductor laser element 20.

If necessary, a P-type GaAs buffer layer (not illustrated) may be disposed between the P-type GaAs substrate 31 and the P-type cladding layer 32, and furthermore, an N-type GaAs contact layer (not illustrated) may be disposed on the lower side of the N-type cladding layer 34.

On the lower surface of the N-type cladding layer 34, an insulating layer 35 of SiO$_2$ is formed and patterned to the prescribed shape as shown in FIG. 2. An N-type electrode 36, which serves as a lower electrode of the semiconductor laser element 30, is formed by depositing a thin film of AuGe/Ni/Au by vacuum evaporation method on the lower surface of the N-type cladding layer 34 through the insulating layer 35 and then heat-treating this deposited thin film to achieve an ohmic contact in the same way as described above.

On the bottom surface of the N-type electrode 36 is formed by vacuum evaporation method a solder layer (brazing metal) 37 to be bonded to the P-type electrode 26 of the semiconductor laser element 20 which is the lower-positioned element in the semiconductor laser device as shown in FIG. 1. The construction of this solder layer 37 is the same as that of the solder layer 28.

On the other hand, a P-type electrode 38, which serves as an upper electrode of the semiconductor laser element 30, is formed by depositing, on the upper surface of the P-type substrate 31, a thin film of Cr/Au by the same forming method as that for the N-type electrode 27 and then heat-treating this thin film to achieve an ohmic contact. On the top surface of the P-type electrode 38 is formed a bonding electrode 39 by depositing a thin film of Au by vacuum evaporation method.

The distance from the surface of the P-type electrode 26 of the semiconductor laser element 20 to the light emitting layer 23 and the distance from the surface of the N-type electrode 36 of the semiconductor laser element 30 to the light emitting layer 33 are approximately 5 μm respectively.

Next, a method of bonding both semiconductor laser elements 20 and 30 to the pedestal 10 will be described.

The semiconductor laser element 20 is bonded to the pedestal 10 as follows: the semiconductor laser element 20 is mounted on the surface 11 of the pedestal 10 through the solder layer 28, and the solder layer 28 is welded to the surface 11 of the pedestal 10 at a temperature of approximately 370° C. while load is applied to the semiconductor laser element 20 from the above by using a die bonder.

Then, the semiconductor laser element 30 is stacked and bonded to the semiconductor laser element 20 as follows: the semiconductor laser element 30 is mounted on the P-type electrode 26 of the semiconductor laser element 20 through the solder layer 37 and the solder layer 37 is brazed to the P-type electrode 26 in the same way as the bonding method for the semiconductor laser element 20 to the pedestal 10. As a result, the distance between the light emitting layer 23 of the semiconductor laser element 20 and the light emitting layer 33 of the semiconductor laser element 30 can be shortened to approximately 10 μm (D3 in FIG. 3) on condition that both the semiconductor laser elements 20 and 30 are so bonded that the laser beam irradiation plane thereof can be in the same direction.

On the top surface of the bonding electrode 39 of the semiconductor laser element 30 is bonded a wire 39a of Au by using a wire bonder.

In such preferred embodiment according to the present invention constructed as described above, the mode of operation and effect of the present invention when the stack type semiconductor laser device according thereto is applied to an actual optical instrument will be described by referring to FIGS. 3 and 4 in comparison with FIGS. 7 and 8.

Figure 3:
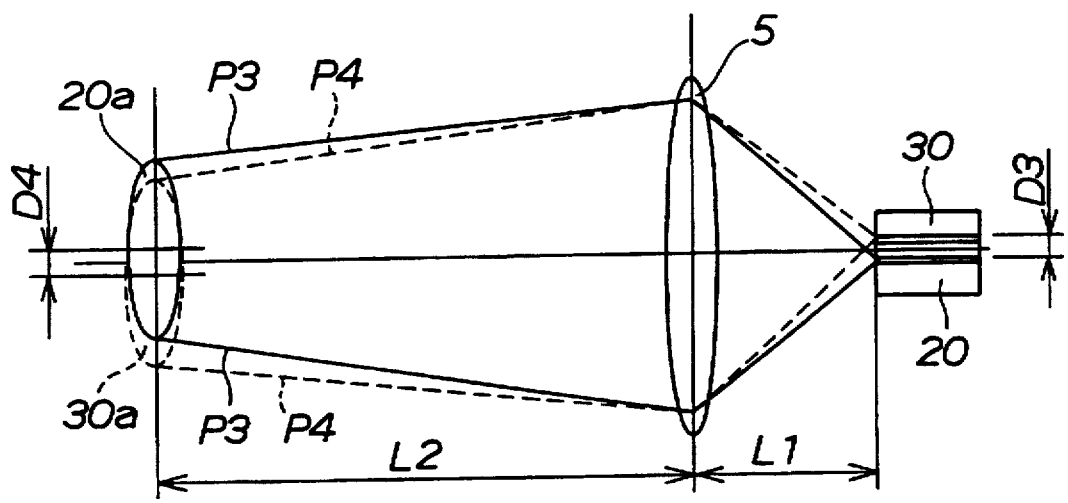
FIG. 3 is a schematic diagram for use in describing the effect that may be obtained when the semiconductor laser device of FIG. 1 is applied to an actual optical instrument.
Figure 4:
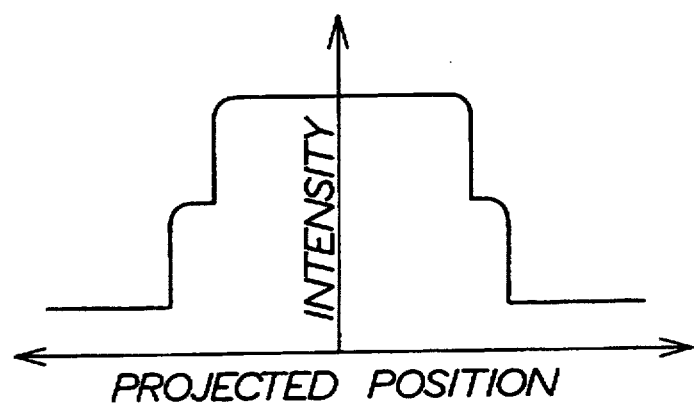
FIG. 4 is a graph illustrating the distribution of the laser beam intensity ahead of a lens when the semiconductor laser device of FIG. 1 is applied to an actual optical instrument.

As illustrated in FIG. 3, when laser beams are irradiated forward ahead of a lens 5 of an actual optical instrument from the respective semiconductor laser elements 20 and 30 of the stack type semiconductor laser device according to the present embodiment, beam patterns 20a and 30a are obtained respectively.

These beam patterns 20a and 30a are formed by the laser beams irradiated from the semiconductor laser elements 20 and 30, respectively. To be more specific, the laser beams irradiated from the semiconductor laser element 20 advance in an optical path P3, passing through the lens 5, and form the beam pattern 20a, while the laser beams irradiated from the semiconductor laser element 30 advance in an optical path P4, passing through the lens 5, and form the beam pattern 30a.

As described above, in the stack type semiconductor laser device according to the present embodiment, both the semiconductor laser elements 20 and 30 are bonded in close proximity to each other as seen in the gap between the light emitting layers 23 and 33 set to D3=10 μm. Therefore, the gap D4 between the centers of the respective beam patterns 20a and 30a ahead of the lens 5 is substantially smaller in comparison with the prior art illustrated in FIG. 7.

Figure 7:
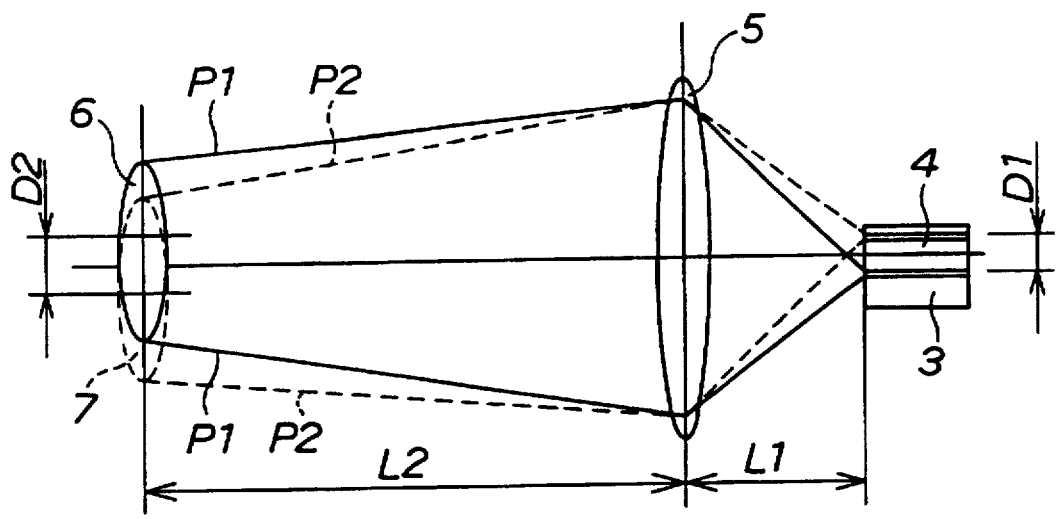
FIG. 7 is a schematic diagram for use in pointing out a problem when the semiconductor laser device of FIG. 6 is applied to an actual optical instrument.
Figure 8:
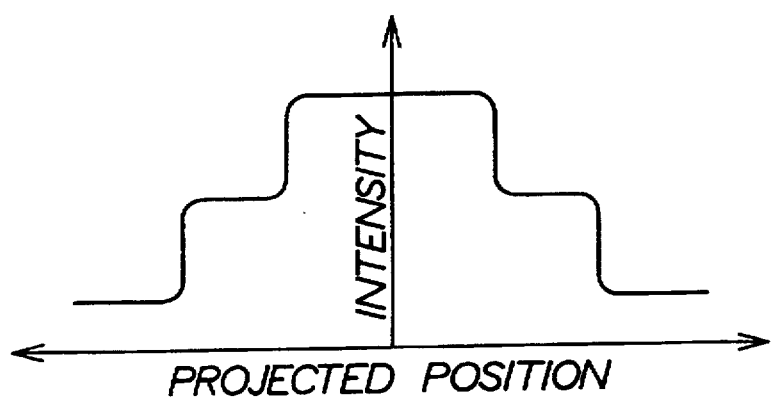
FIG. 8 is a graph illustrating the distribution of the laser beam intensity ahead of a lens when the semiconductor laser device of FIG. 6 is applied to an actual optical instrument.

For example, in the same way as the prior art illustrated in FIG. 7, when it is supposed that L1=20 mm and L2=100 m and these lengths are substituted for the equation (1) together with D3=10 μm, it is calculated that the gap D4 between the centers of the respective beam patterns 20a and 30a in FIG. 3 is 5 cm at 100 m ahead of the lens 5. This shows an improvement of the gap D4 to be 1/10 of the conventional stack type semiconductor laser device.

Accordingly, the divergence between both the beam patterns 20a and 30a remarkably decreases in comparison with the divergence between both the beam patterns 6 and 7 in FIG. 7. In other words, the overlapped area of both the beam patterns 20a and 30a markedly increases in comparison with the overlapped area of both the beam patterns 6 and 7. As a result, as illustrated in FIG. 4, the area where the laser beam intensity ahead of the lens 5 is uneven substantially decreases in comparison with that of the prior art, and thus, the precision of the distance measurement can remarkably be improved.

Figure 5:
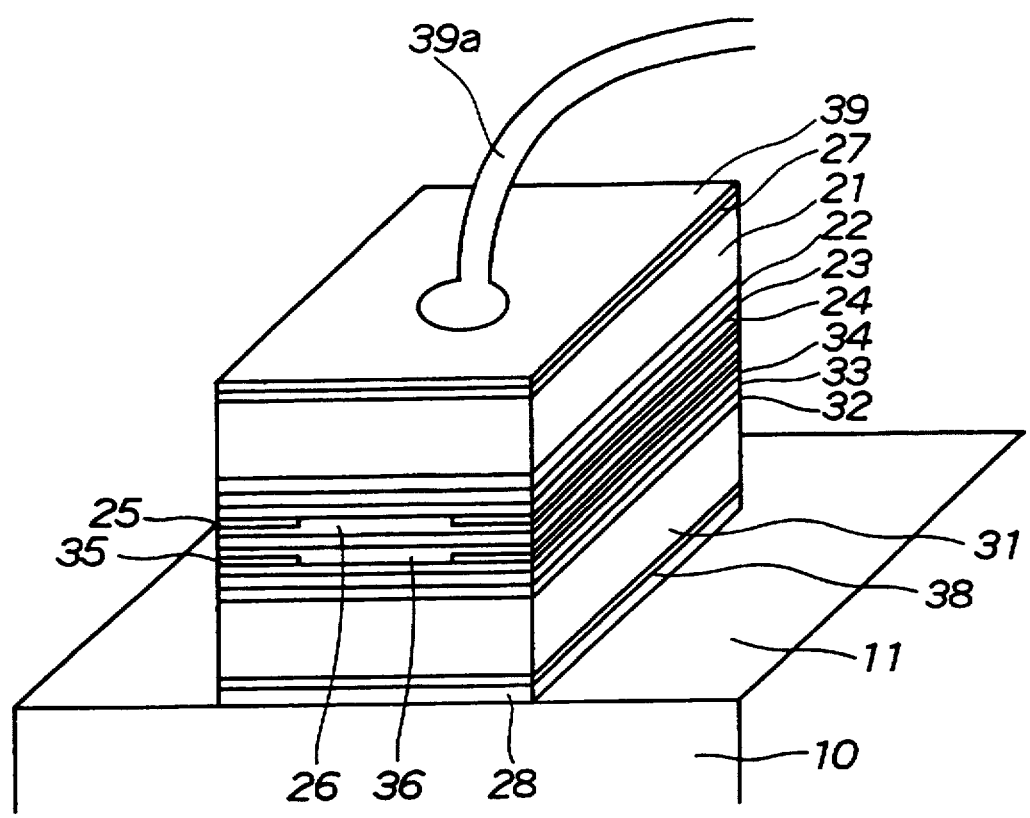
FIG. 5 is a perspective view illustrating a modification to the embodiment of FIG. 1.
Figure 6:
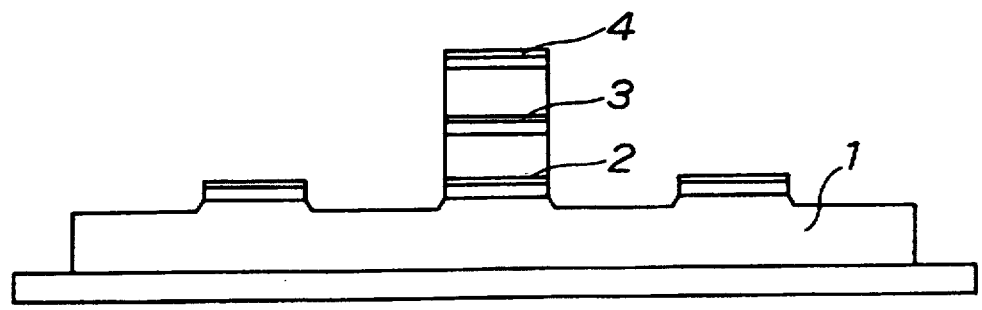
FIG. 6 is a front view of a conventional stack type semiconductor laser device.

FIG. 5 illustrates a modification to the above-described embodiment.

In both the semiconductor laser elements 20 and 30 according to this modification, the integral part from the N-type electrode 27 of the semiconductor laser element 20 to the P-type electrode 38 of the semiconductor laser element 30 shown in FIG. 1 is reversed upside down as it is and disposed between the bonding electrode 39 and the solder layer 28. The manufacturing method for each of the semiconductor laser elements 20 and 30 bonded in such construction is substantially the same as that of the embodiment described above.

Therefore, also in this modification, the same effect of the semiconductor laser device as the embodiment described above can be obtained. Here, as the semiconductor laser device according to this modification is reverse upside down to the semiconductor laser device of the above-described embodiment in position of the P-type substrate and N-type substrate, the current flow direction of the modification is reverse to that of the above-described embodiment.

Here, the application of the present invention should not be limited to the stack type semiconductor laser device having semiconductor laser elements of quantum well structure with superlattices. Alternatively, the present invention may be applied to a stack type semiconductor laser device having semiconductor laser elements of other types, such as semiconductor laser elements of PN junction structure and double hetero junction structure. Also, substrates to be used for semiconductor laser elements should not be limited to the GaAs substrates but P-type and N-type InP substrates, for example, may be employed as substrates to be used for the respective semiconductor laser elements.

In addition, in utilizing the present invention, the bonding layer should not be limited to the solder layer 37 but alternatively a brazing metal layer may be employed.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A stack type semiconductor laser device comprising:
    a first semiconductor laser element which comprises a first conductivity type substrate, a first semiconductor laser including a first light emitting layer and disposed on a primary surface of said first conductivity type substrate, a first electrode disposed on said first semiconductor layer, and a second electrode disposed on a secondary surface of said first conductivity type substrate;
    a first connector, connected to said second electrode, for supplying operational current to said laser device;
    a second semiconductor laser element which comprises a second conductivity type substrate, a second semiconductor layer including a second light emitting layer and disposed on a primary surface of said second conductivity type substrate, a third electrode disposed on said second semiconductor layer, and a fourth electrode disposed on a secondary surface of said second conductivity type substrate;
    a second connector, connected to said fourth electrode, for receiving operational current supplied by said first connector; and
    a pedestal to which said second electrode of said first semiconductor laser element is bonded,
    wherein said second semiconductor laser element is stacked on said first semiconductor element with said first electrode of said first semiconductor element and said third electrode of said second semiconductor laser element being conductively bonded to each other in such a manner that both beam irradiation directions of said first and second semiconductor laser elements are the same.

2. A stack type semiconductor laser device according to claim 1, further comprising a brazing metal layer which electrically and mechanically connects said first electrode of said first semiconductor laser element and the third electrode of said second semiconductor laser element.

3. A stack type semiconductor laser device according to claim 2, wherein said brazing metal layer is a solder layer.

4. A stack type semiconductor laser device according to claim 1, wherein said first conductivity type is an N type and said second conductivity type is a P type.

5. A stack type semiconductor laser device according to claim 1, wherein said first conductivity type is a P type and said second conductivity type is an N type.

6. A stack type semiconductor laser device comprising:

a first laser element having a first conductivity type substrate and a first semiconductor layer including a first light emitting layer and disposed on said first conductivity type substrate;

a first connector, connected to said first conductivity type substrate, for supplying operational current to said laser device;

a second laser element having a second conductivity type substrate and a second semiconductor layer including a second light emitting layer and disposed on said second conductivity type substrate; and a second connector, connected to said second conductivity type substrate, for receiving operational current supplied by said first connector;

wherein said first laser element and said second laser element are laid out in such a way that each laser beam irradiation plane thereof faces to the same direction, and said first semiconductor layer and said second semiconductor layer are bonded conductively to one another.

7. A stack type semiconductor laser device comprising:

a first laser element with a first light emitting layer disposed on a first conductivity type substrate;

a first connector, connected to said first conductivity type substrate, for supplying operational current to said laser device;

a second laser element with a second light emitting layer disposed on a second conductivity type substrate; and a second connector, connected to said second conductivity type substrate, for receiving operational current supplied by said first connector;

wherein said first laser element and said second laser element are stacked in such a manner that said first light emitting layer and said second light emitting layer are interposed between said first conductivity type substrate and said second conductivity type substrate and provide the same light emitting direction.

8. A stack type semiconductor laser device comprising:

a first semiconductor laser element structured by an N-type substrate, a first epitaxial growth layer including a first light emitting region disposed on a primary surface of said N-type substrate, a P-type electrode disposed on said first epitaxial growth layer, and an N-type electrode disposed on a secondary surface of said N-type substrate;

a first connector, connected to said N-type electrode of the first semiconductor laser element, for supplying operational current to said laser device;

a second semiconductor laser element structured by a P-type substrate, a second epitaxial growth layer including a second light emitting region disposed on a primary surface of said P-type substrate, an N-type electrode disposed on said second epitaxial growth layer, and a P-type electrode disposed on a secondary surface of said P-type substrate;

a second connector, connected to said P-type electrode of the second semiconductor laser element, for receiving operational current supplied by said first connector; and a brazing metal layer electrically and mechanically connecting said P-type electrode of said first semiconductor laser element and said N-type electrode of said second semiconductor laser element in such a manner that said first and second light emitting regions have the same light emitting direction.

9. A stack type semiconductor laser device according to claim 8, wherein said first semiconductor laser element is located below said second semiconductor laser element.

10. A stack type semiconductor laser device according to claim 8, wherein said second semiconductor laser element is located below said first semiconductor laser element.

11. A stack type semiconductor laser device according to claim 8, wherein said brazing metal layer is a solder layer.

* * * * *